(12) United States Patent
Stevenson

(10) Patent No.: US 8,279,101 B1
(45) Date of Patent: Oct. 2, 2012

(54) HIGH-SPEED MULTI-TYPE SUBSTRATE ANALOG TO DIGITAL CONVERTER

(75) Inventor: Jan-Michael Stevenson, Frisco, TX (US)

(73) Assignee: CSR Technology Inc., Sunnyvale, CA (US)

( * ) Notice: Subject to any disclaimer, the term of this patent is extended or adjusted under 35 U.S.C. 154(b) by 50 days.

(21) Appl. No.: 12/944,563

(22) Filed: Nov. 11, 2010

(51) Int. Cl.
*H03M 1/12* (2006.01)
(52) U.S. Cl. .......................... 341/155; 341/122; 341/136
(58) Field of Classification Search .................. 341/122, 341/155, 136, 118
See application file for complete search history.

(56) References Cited

U.S. PATENT DOCUMENTS 6,999,019 B2 * 2/2006 Cosand .......................... 341/156
* cited by examiner

*Primary Examiner* — Peguy Jean Pierre
(74) *Attorney, Agent, or Firm* — Fulbright & Jaworski L.L.P.

(57) ABSTRACT

High conversion rates are achieved in an analog to digital converter by tailoring the substrate type to specific operational elements of the converter. Embodiments place sample and hold processing circuitry on a substrate type having properties that allow for faster processing at high sampling/clock frequencies. Other operational elements of the converter are constructed on at least one other substrate type in keeping with the remainder of the circuitry for which the converter is being implemented. The sample and hold substrate may be implemented on any material which is capable of faster processing, such as silicon germanium, gallium arsenide, silicon bipolar, BiCMOS, and the like. Other portions may be implemented on a more CMOS substrate. Such systems and methods are able to implement analog-to digital conversion for broadband signals at high speeds without the need for extensive timing compensation, while also avoiding problems due to noise from further digital processing circuitry.

7 Claims, 2 Drawing Sheets

HIGH-SPEED MULTI-TYPE SUBSTRATE ANALOG TO DIGITAL CONVERTER

TECHNICAL FIELD

The present disclosure relates generally to signal processing devices and analog-to-digital conversion of signals. More specifically, the present disclosure relates to improving performance of signal processing devices by splitting functionality of the devices between multiple substrate types.

BACKGROUND

In current tuner systems digital processing is generally implemented in complimentary metal-oxide-semiconductor (CMOS) only processes. Additionally, in the tuner industry, as with many industries, there is a general trend to miniaturize and compact all circuitry onto a single circuit which is capable of accomplishing a manufacturer's design and performance goals. Accordingly, current tuner systems and their corresponding digital processing needs are normally implemented within a single circuit (e.g. CMOS) framework. Moreover, when design issues occur, solutions to these problems are sought within this single circuit framework.

Current analog-to-digital converters (ADCs) in tuner systems are also generally implemented in a CMOS only process. FIG. 1 illustrates a prior art CMOS implementation of an ADC architecture 100. Prior art CMOS ADC systems include sample and hold circuitry 110 which samples a varying analog input signal and then holds it for a particular amount of time while ADC 120 can implement processing. The converted signal is then sent to digital processing circuitry 130. Prior art ADCs which are implemented in CMOS processors generally implement sample and hold circuitry 110 using a switch 111 and a capacitor 112 such that when switch 111 closes, the capacitor 112 charges at which point switch 111 opens. In such prior art ADC systems, a designer is able to achieve a high resolution, e.g. a high number of effective bits, generally at low frequencies such as at a 200-300 megahertz sampling frequencies. One problem with such prior art systems is that there is a settling time involved within sample and hold circuitry 110 because switch 111 is resistive. Because of this, such systems cannot implement an acceptable sample and hold that can function at high frequencies, e.g. between 2.5 to 3.5 gigahertz.

Accordingly, when implementing an ADC at these higher frequencies, the ADC requires much quicker response within the sample and hold than is possible with the architecture of FIG. 1. In order to accomplish an ADC that is able to function at an acceptable rate, most prior art systems implement what is called a time interleaved approach which utilize multiple ADCs 120. A time interleaved method generally utilizes multiple parallel ADCs 120 where each ADC receives sample data from respective circuits 110 at pre-specified intervals within a sampling clock cycle. While this approach increases the response speed of ADC devices, such an approach creates further design problems. For example, such implementations may have errors introduced into the sample and hold circuitry which originates from switching noise of the digital processing circuitry 130. Additionally, if a device has multiple ADCs but has several slower sample and hold circuits (such as shown in FIG. 1), difficult timing issues arise when lining up the samples. Because of these timing problems, a designer must be extremely accurate in order to avoid errors. If timing errors occur at the ADC stage, such errors are generally not correctable in the digital processing circuitry 130. In some instances, an optional sample and hold circuit 140 may be implemented to assist in remedying these timing errors.

Attempts have been made to produce ADC systems which network at higher frequencies. For example, ADCs have been implemented on non-CMOS substrates at very high frequency sampling rates. However, such systems are generally not capable of achieving sufficiently high resolution (e.g. 2-3 effective bits) for applications that require a high number of effective bits to be transmitted for further digital processing. Further, such systems generally have higher power requirements then similar CMOS counterparts, which makes them unacceptable in many design applications.

BRIEF SUMMARY

High conversion rates are achieved in an analog to digital converter by tailoring the substrate type to specific operational elements of the converter. Embodiments place sample and hold processing circuitry on a substrate type having properties that allow for faster processing at high sampling/clock frequencies. Other operational elements of the converter are constructed on at least one other substrate type in keeping with the remainder of the circuitry for which the converter is being implemented. The sample and hold substrate may be implemented on any material which is capable of faster processing, such as silicon germanium, gallium arsenide, silicon bipolar, BiCMOS and the like. Other portions may be implemented on a more CMOS substrate. Such systems are counter to the current development trends of the art as implementation is split onto separate circuits. Further, such systems are able to implement analog-to digital conversion for broadband signals at high speeds without the need for extensive timing compensation, while also avoiding problems due to noise from further digital processing circuitry.

In one embodiment, inventive concepts may be implemented in a tuner system. The tuner system includes input circuitry configured to receive a broadband transmission signal. The broadband signal may be sent to an ADC which includes a sample and hold portion implemented on a first substrate, and a conversion portion implemented on a second substrate. The substrate which includes the sample and hold portion is configured to have superior frequency response characteristics with respect to high sampling frequencies than the second substrate. The conversion portion is configured to convert the broadband transmission signal to a digital signal. The tuner system further includes digital signal processing circuitry configured to receive the converted input signal and to tune to at least one channel within the broadband transmission signal.

In more detailed embodiments, the tuner system may include a phase-locked loop (PLL) circuit on the first substrate which is configured to provide a sampling frequency signal to the sample and hold portion. This PLL circuit may be further configured to provide a clock signal to the conversion portion and digital signal processing circuitry. Embodiments may place various components on the differing substrates in accordance with performance capabilities of the respective substrates and to achieve noise isolation goals. For example, a PLL circuit may have improved jitter performance when implemented on a non-CMOS substrate. Additionally, it may be advantageous to isolate digital processing circuitry from sample and hold circuitry to mitigate noise errors.

One exemplary embodiment includes a method which receives an analog input signal at a sample and hold circuit, where the sample and hold circuit is implemented on a substrate of a first type. A portion of the input signal is then held for a pre-determined period of time. The method may further include transmitting said portion of the analog input signal from the sample and hold circuit on the first substrate to an ADC circuit on a substrate of a second type. The ADC circuit may then convert the analog input signal into a digital signal and the method outputs the digital signal to a signal processing circuit which is manufactured on the second substrate.

Another exemplary embodiment includes a method of manufacturing an ADC device. The method includes forming an ADC circuit on a first substrate. The method further includes forming a sample and hold architecture on a second substrate, where the second substrate has superior frequency response characteristics when utilized at high sampling frequencies than the first substrate. Further, the method communicatively connects said ADC on said first substrate to said sample and hold architecture on said second substrate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
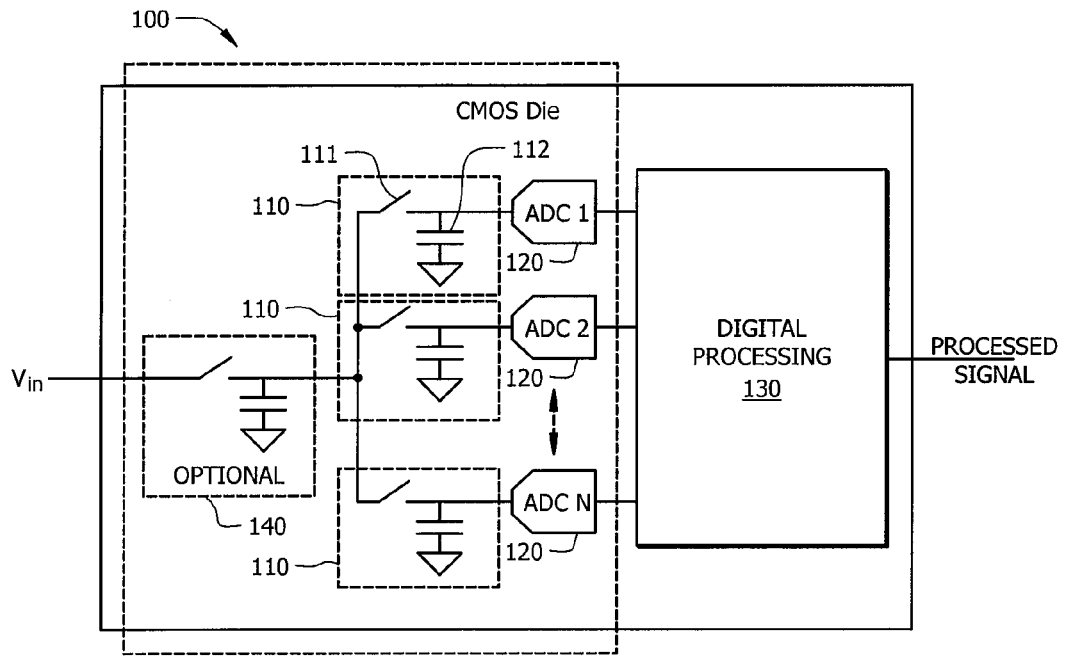
FIG. 1 illustrates a prior art CMOS implementation of an ADC architecture.
Figure 2:
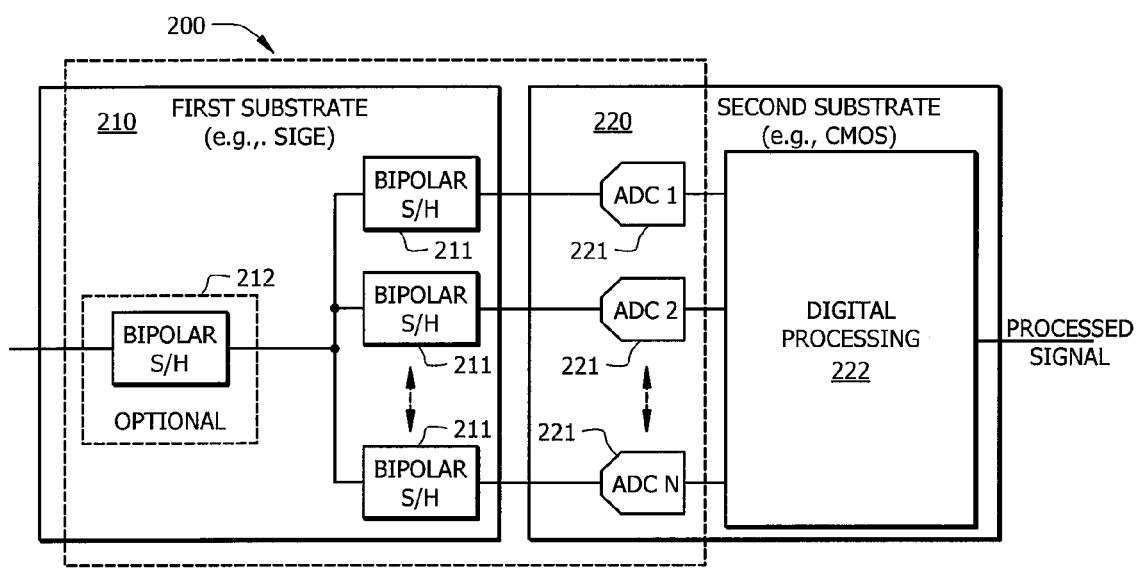
FIG. 2 illustrates an ADC architecture in accordance with an embodiment of the present invention.

FIG. 2 illustrates an ADC architecture 200 in accordance with an embodiment of the present invention. In this embodiment, ADC architecture 200 is split between a first substrate 210 and a second substrate 220. First substrate 210 is manufactured from a material which is capable of better performance than a CMOS circuit at high frequencies. Examples of such materials are silicon germanium, gallium arsenide, silicon bipolar, BiCMOS and the like. Such better performance may include allowing for improved settling time of sample and hold circuitry at high sample rates. Additionally, such performance may include improved jitter control for sampling clock at high sampling rates. First substrate 210 includes sample and hold circuitry 211. In some embodiments sample and hold circuitry 211 is implemented as a bipolar sample and hold which utilizes at least one bipolar transistor. The use of a bipolar transistor offers advantages over standard sample and hold circuitry implemented in CMOS in that it is capable of much faster processing speeds and more readily manufactured on the materials utilized for first substrate 210. First substrate 210 may also include an optional sample and hold circuit 212 to assist in timing compensation in time-interleaved ADC implementations.

Second substrate 220 may be implemented as a standard CMOS substrate. Second substrate 220 includes ADC 221 which is configured to receive a signal which has been conditioned by sample and hold circuitry 211 from first substrate 210. Because sample and hold circuitry 211 is implemented in a manner which allows for faster settling times when receiving high-frequency input signals, and because ADC architecture 200 utilizes time-interleaving methods which multiple sample and hold 211 circuits and multiple ADC 221 circuits, the actual processing capabilities of the CMOS circuitry may be reduced and simplified.

In some embodiments, first substrate 210 and second substrate 220 are implemented on two separate chips. These chips may be placed in a single package and connected together electrically with bondwires that go from pads on the first chip to pads on the second chip. This is may be referred to as a system-in-package (SIP) or a multi-chip module (MCM).

After processing is implemented in ADC 221, a digital signal is output to digital processing block 222. It is further noted that because digital processing block 222 is isolated from sample and hold circuitry 211, switching noise which normally occurs within digital processing block 222 will not adversely affect sample and hold circuitry 211 as would be done in prior art systems.

As a result of utilizing ADC architecture 200, embodiments of the present invention are able to achieve a high level of resolution (e.g. 10-12+ effective bits) while using a high frequency sampling rate (e.g. 3 GHz). Additionally, as outlined below, the use of separate substrates, which runs counter to traditional design preferences, provides further advantages for an overall tuner system.

Figure 3:
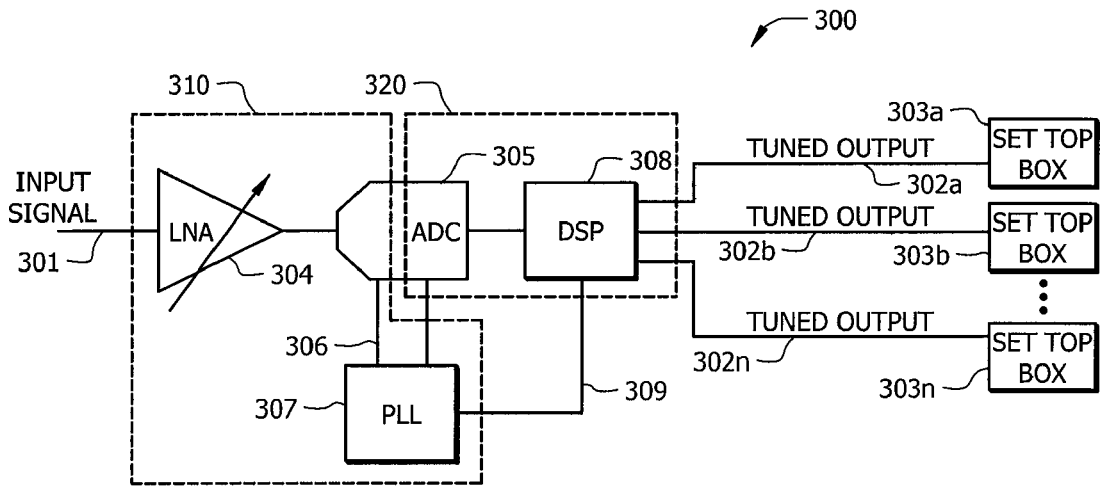
FIG. 3 illustrates a tuner system in accordance with an embodiment of the present invention.

FIG. 3 illustrates a tuner system 300 in accordance with an embodiment of the present invention. Tuner 300 is configured to receive a broadband analog input signal 301 which typically contains a plurality of channels of a specified width and to provide a tuned output signal 302 corresponding to a channel within the broadband analog input signal 301. Tuner 300 may be implemented within a consumer television set-top box in which case tuned output signal 302 is sent to a display device. Additionally, tuner 300 may be implemented as a master tuner which is configured to provide multiple tuned output signals 302a-n to multiple set-top boxes 303a-n. Tuner 300 need not be used in direct connection with a television or other viewing device but can be used if desired for tuning anywhere in a distribution system including for example for storage purposes.

Input signal 301 is received and low noise amplifier (LNA) 304. LNA 304 functions to condition the input signal and to provide gain into tuner system 300. Signal conditioning may include performing to correction to compensate for portions of the input frequency spectrum which are received at higher power levels with respect to other portions of the input frequency spectrum. A conditioned signal with a flat power characteristic across the input frequency spectrum will assist in providing an improved dynamic range for an ADC.

The amplified input signal is then sent to ADC 305. ADC 305 may be implemented utilizing ADC architecture 200 as described in FIG. 2 above. ADC 305 includes sample and hold circuitry (not shown) which functions at a sampling rate which is facilitated by a sampling signal 306 provided by phase-locked loop (PLL) 307. In some embodiments the bandwidth of input signal 301 may be approximately one gigahertz wide. In these embodiments, ADC 305 will preferably have a sampling frequency of at least 2.5 GHz.

The converted digital signal is then provided to digital signal processor (DSP) 308. DSP 308 functions to tune one or more particular channels present in input signal 301 in order to provide tuned output signals 302a-n. Digital signal processor 308 may function at a clock signal 309 provided by PLL 307, or may be provided a clock signal from a separate component.

Embodiments may implement portions of tuner system 300 on separate substrates. For example, tuner system 300 may include a first substrate 310 and a second substrate 320. As described with respect to FIG. 2, portions of ADC 305 may be split between two separate substrates. First substrate 310 may be implemented as a substrate which is capable of functioning at faster sampling frequencies with respect to a second substrate 320. For example, first substrate 310 may implement sample and hold circuitry within ADC 305 on a silicon germanium substrate which is capable of a much quicker settling time than a standard CMOS substrate.

In addition to ADC 305 being split between substrates 310 and 320, it may be advantageous to implement further circuitry of tuner system 300 on first substrate 310. For example PLL 307, when implemented on a substrate such as silicon germanium, gallium arsenide, silicon bipolar, or BiCMOS may be designed such that it has improved jitter performance with respect to a similar PLL implemented in CMOS. Additionally, LNA 304 may be implemented on first substrate 310 in order to provide improved linearity, thermal noise, and digital switching noise isolation.

Further, it may be advantageous to implement other portions of tuner system 300 on second substrate 320. For example, ADC functions, aside from the sample and hold circuitry, and DSP 308 may be better implemented on a CMOS substrate. Such a substrate may be better suited to provide a cheap and efficient implementation of these devices. Additionally, separating DSP 308 from portions of ADC 305 isolates excessive noise which may emanate from DSP 308, which further improves the performance of ADC 305.

The system outlined in FIG. 3 illustrates one example layout for an embodiment of the present invention. It is noted that one of skill in the art may select locations for a particular components of tuner system 300 based on any number of considerations corresponding to first substrate 310 and second substrate 320 including performance-based considerations, real estate considerations, and the like.

Figure 4:
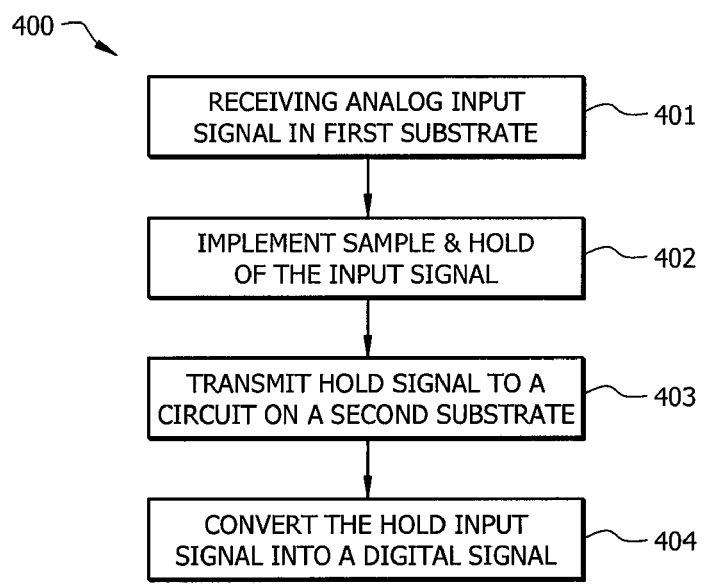
FIG. 4 illustrates a flowchart corresponding to a method for converting an analog input signal to a digital signal in accordance with an embodiment of the present invention.

FIG. 4 illustrates a flowchart corresponding to a method 400 for converting an analog input signal to a digital signal in accordance with an embodiment of the present invention. The method includes receiving an analog input signal at a circuit implemented on first substrate 401. Once the signal is at the circuit, the method implements a sample and hold of the input signal at the circuit on the first substrate 402. The held signal is then sent to a second circuit which is implemented on a second substrate 403. The second circuit functions to process the held input signal and convert the signal into a digital signal 404. Embodiments may have one or more of the aforementioned processes implemented in parallel. For example, an analog to digital conversion may be implemented on a portion of an input signal while a different portion of the input signal is being held by the sample and hold circuitry. Further, this method may be implemented by the systems and devices described above with respect to FIGS. 2-3.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A tuner system comprising:
   input circuitry configured to receive a broadband transmission signal having a plurality of channels;
   an analog-to-digital converter (ADC) comprising a sample and hold portion implemented on a first substrate and a conversion portion implemented on a second substrate, said first substrate having superior frequency response characteristics with respect to high sampling frequencies than does said second substrate, wherein said ADC is configured to convert said broadband transmission signal to a digital signal; and
   digital signal processing circuitry configured to receive the converted input signal and to tune to at least one channel within said broadband transmission signal.

2. The tuner system of claim 1 wherein said sample and hold portion comprises bipolar sample and hold circuitry.

3. The tuner system of claim 1 wherein the sampling frequency of said sample and hold portion is at least 2.5 GHz.

4. The tuner system of claim 1 wherein said second substrate is CMOS substrate.

5. The tuner system of claim 4 wherein the first substrate is one of:
   a silicon germanium, gallium arsenide, silicon bipolar, and a BiCMOS substrate.

6. The tuner system of claim 5 wherein said first substrate further comprises a phase-locked loop (PLL) circuit configured to provide a sampling frequency signal to said sample and hold portion.

7. The tuner of claim 6 wherein said PLL is configured to provide a clock signal to said digital signal processing circuitry which is located on said second substrate.

* * * * *